US008726206B1

United States Patent
Wang et al.

(10) Patent No.: US 8,726,206 B1
(45) Date of Patent: May 13, 2014

(54) DEADLOCK DETECTION METHOD AND RELATED MACHINE READABLE MEDIUM

(71) Applicant: Realtek Semiconductor Corp., HsinChu (TW)

(72) Inventors: Ting-Hsiung Wang, Kaohsiung (TW); Yu-Lan Lo, Hsinchu County (TW); Shu-Yi Kao, Hsinchu County (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/051,459

(22) Filed: Oct. 11, 2013

(30) Foreign Application Priority Data

Jan. 23, 2013 (TW) .............................. 102102476 A

(51) Int. Cl.
G06F 9/455 (2006.01)
G06F 17/50 (2006.01)

(52) U.S. Cl.
USPC ............................ 716/106; 716/104; 716/136

(58) Field of Classification Search
CPC .............. G06F 17/5022; G06F 17/504; G06F 17/5045; G06F 17/505; G06F 17/5059; G06F 17/5031
USPC .......................................... 716/104, 106, 136
See application file for complete search history.

(56) References Cited

U.S. PATENT DOCUMENTS

| 6,336,204 | B1 * | 1/2002 | Jevtic ............................ 700/121 |
| 6,408,262 | B1 * | 6/2002 | Leerberg et al. .................. 703/2 |
| 7,124,405 | B1 * | 10/2006 | Kakivaya et al. ............. 717/143 |
| 8,266,573 | B2 * | 9/2012 | Sasaki ............................ 716/136 |
| 8,381,148 | B1 * | 2/2013 | Loh et al. ........................ 716/106 |
| 2003/0188278 | A1 * | 10/2003 | Carrie ................................ 716/4 |
| 2012/0096317 | A1 * | 4/2012 | Li et al. ........................ 714/38.1 |
| 2012/0198460 | A1 * | 8/2012 | Luo et al. ....................... 718/102 |

OTHER PUBLICATIONS

Abraham Silberschatz, Peter B. Galvin, Greg Gagne, Operating System Concepts, eighth edition , 2008, chapter VII, John Wiley & Sons, Inc.

* cited by examiner

Primary Examiner — Vuthe Siek
Assistant Examiner — Brian Ngo
(74) Attorney, Agent, or Firm — Winston Hsu; Scott Margo

(57) ABSTRACT

A deadlock detection method includes: retrieving at least one power node input of a circuit design file of an integrated circuit; retrieving a starting order of the power node; retrieving a target path starting from a specific node in accordance with the starting order; and performing deadlock detection in accordance with the starting order and the target path. A non-transitory machine readable medium stores a program code, wherein when executed by a processor, the program code enables the processor to perform the following steps: retrieving at least one power node input of a circuit design file of an integrated circuit; retrieving a starting order of the power node; retrieving a target path starting from a specific node in accordance with the starting order; and performing deadlock detection in accordance with the starting order and the target path.

14 Claims, 7 Drawing Sheets

DEADLOCK DETECTION METHOD AND RELATED MACHINE READABLE MEDIUM

BACKGROUND OF THE INVENTION

1. Field of the Invention

The disclosed embodiments of the present invention relate to verifications of circuit design, and more particularly, to a deadlock detection method for detecting whether deadlock occurs in a circuit path and a related machine readable medium.

2. Description of the Prior Art

Developments in integrated circuit technology go hand in hand with the number of transistors accommodated in an integrated circuit, in accordance with Moore's Law. As both the size and complexity of integrated circuits grows, design verification for ensuring consistency between the design and the specification has become the biggest challenge in the field of integrated circuit design. Static verification is faster; static verification, however, only detects potential errors or defects in a design, but cannot verify the design in every aspect with high assurance, especially the functionality. While simulations can accurately reflect circuit behavior in a real chip, large designs make simulations time-consuming, especially in a digital/analog mixed-signal circuit design. Hence, an IC designer usually performs simulation and validation upon each circuit module separately to obtain enough simulation results within a reasonable simulation time. Although such practices can quickly obtain the functional verification of each circuit module, there could be deadlock between circuit modules. A condition where each circuit module operates normally but deadlock occurs between respective circuit modules will not be detected by the above mentioned simulation process. In conventional processes, the only solution is good communication between circuit designers and manual examiners, which is not only imprecise but also inefficient.

For meeting the demands of efficiency and accuracy, there is a need for an innovative deadlock detection method that can perform verifications upon a complete circuit system containing all of the circuit modules.

SUMMARY OF THE INVENTION

One of the objectives of the present invention is to provide a deadlock detection method for detecting whether deadlock occurs in a circuit path, and a machine readable medium thereof.

According to a first embodiment of the present invention, an exemplary deadlock detection method is disclosed. The exemplary deadlock detection method comprises: retrieving at least one power node input of a circuit design file of an integrated circuit; retrieving a starting order of the power node; retrieving a target path starting from a specific node in accordance with the starting order; and performing deadlock detection in accordance with the starting order and the target path.

According to a second embodiment of the present invention, an exemplary non-transitory machine readable medium is disclosed. The non-transitory machine readable medium stores a program code, wherein when executed by a processor, the program code enables the processor to perform the following steps: retrieving at least one power node input of a circuit design file of an integrated circuit; retrieving a starting order of the power node; retrieving a target path starting from a specific node in accordance with the starting order; and performing deadlock detection in accordance with the starting order and the target path.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
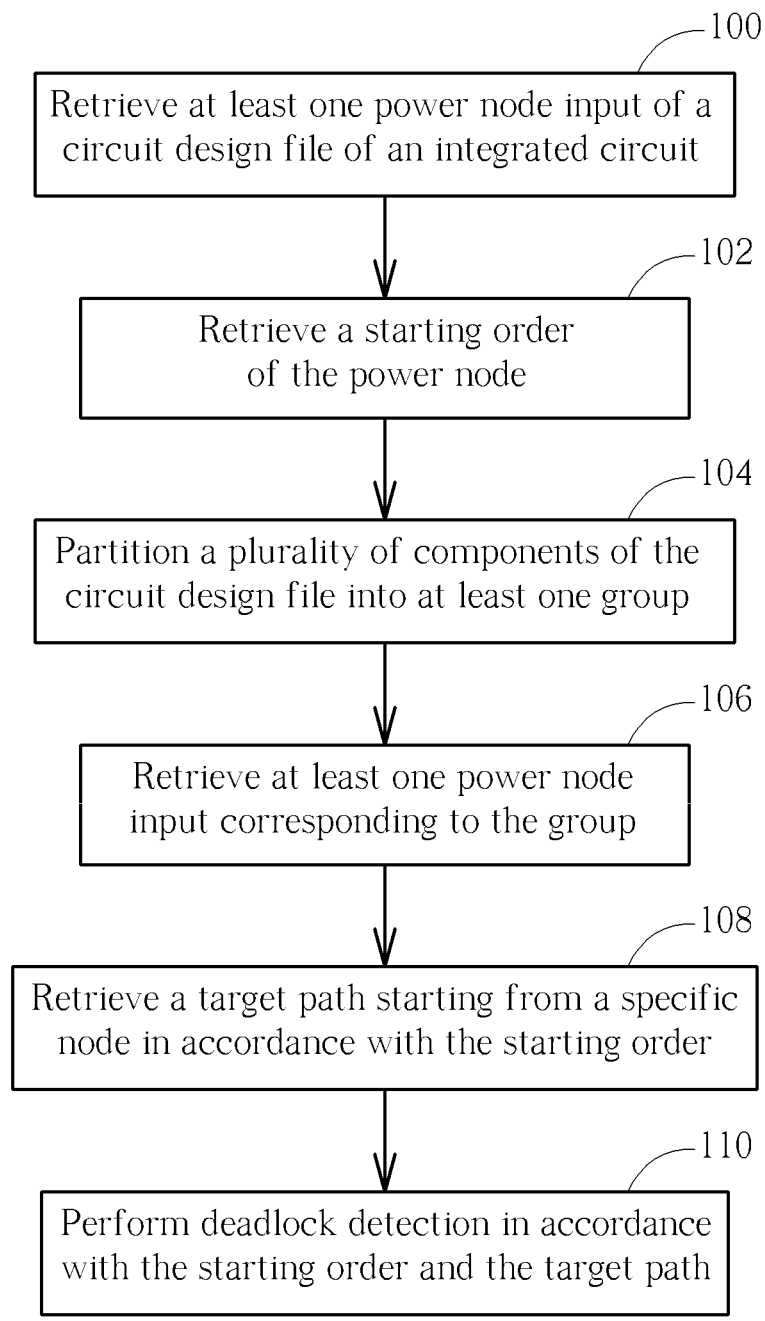
FIG. 1 is a flowchart illustrating a deadlock detection method according to an embodiment of the present invention.

Please refer to FIG. 1, which is a flowchart illustrating a deadlock detection method according to an embodiment of the present invention. Provided that substantially the same result is achieved, the steps in FIG. 1 need not be in the exact order shown and need not be contiguous; that is, other steps can be intermediate. Some steps in FIG. 1 may be omitted according to various types of embodiments or requirements. In this embodiment, the detailed operation of the integrated circuit deadlock detection method comprises the following steps.

Step 100: Retrieve at least one power node input of a circuit design file of an integrated circuit;

Step 102: Retrieve a starting order of the power node;

Step 104: Partition a plurality of components of the circuit design file into at least one group;

Step 106: Retrieve at least one power node input corresponding to the group;

Step 108: Retrieve a target path starting from a specific node in accordance with the starting order; and Step 110: Perform deadlock detection in accordance with the starting order and the target path.

Preferably, the deadlock detection is performed in accordance with a resource allocation graph algorithm.

Figure 2:
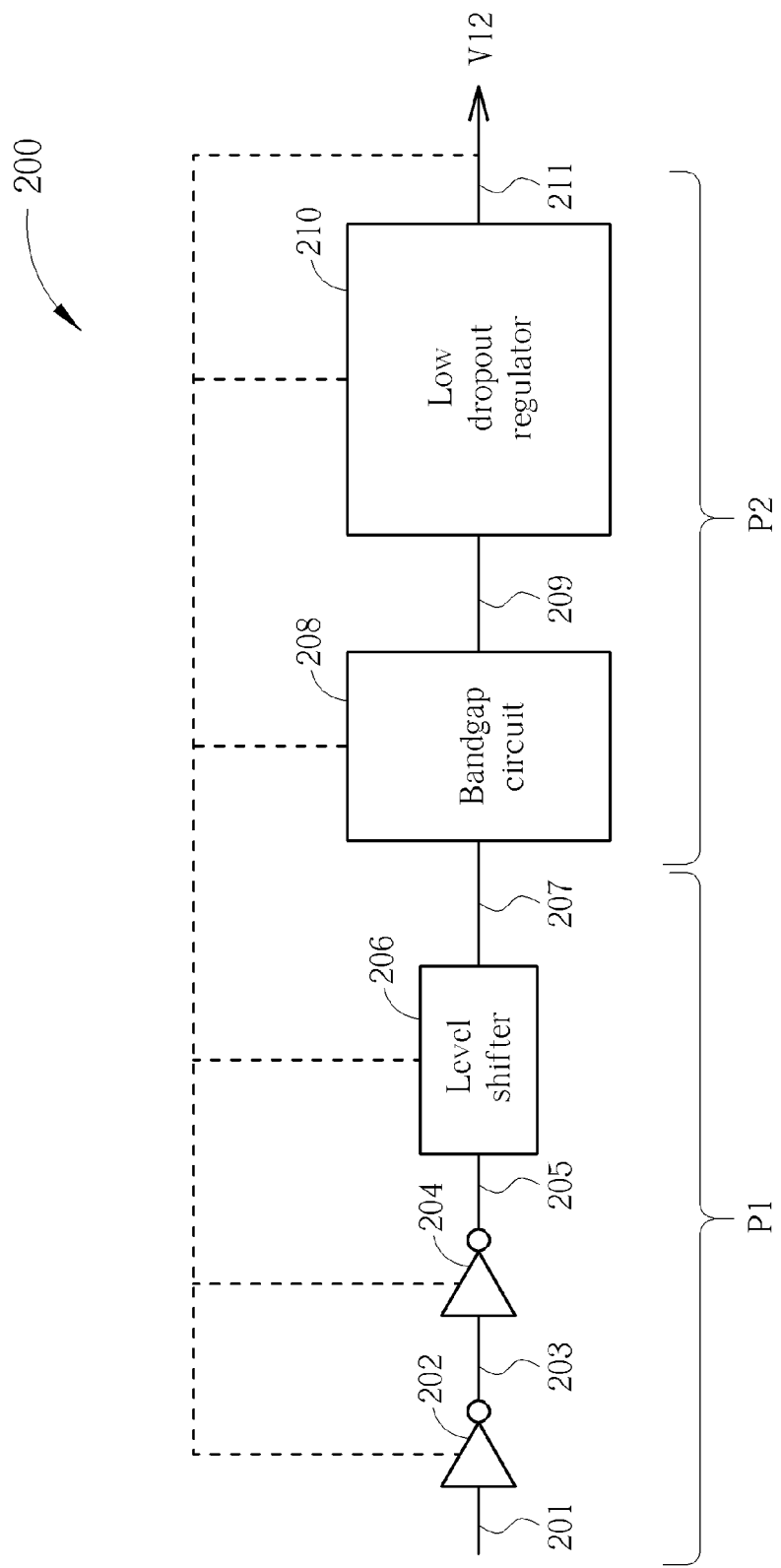
FIG. 2 is a diagram illustrating the deadlock detection method according to an exemplary embodiment of the present invention.

Since the present invention relates to deadlock detection method for loops in a circuit design file of the integrated circuit, all of the power nodes of the circuit design file of the integrated circuit are retrieved first as shown in step 100, and a starting order of the power node inputs can be obtained according to the relationship between the power node inputs (step 102). Please refer to FIG. 2 in conjunction with FIG. 1, wherein FIG. 2 is a diagram illustrating the deadlock detection method according to an exemplary embodiment of the present invention. A power control circuit 200 shown in FIG. 2 includes a first inverter 202, a second inverter 204, a level shifter 206, a bandgap circuit 208, and a low dropout regulator (LDO) 210. The basic components of the integrated circuit are fairly simple—for instance, an adder could be composed of dozens of logic gates—therefore, the plurality of components of the circuit design file can be classified into several groups according to modules and functionalities for analysis purposes. In this embodiment, the complex basic components in the power control circuit 200 can be classified in accordance with five main functional components shown in FIG. 2: the respective basic components of the first inverter 202, the second inverter 204, the level shifter 206, the bandgap circuit 208, and the low dropout regulator 210 have respective correlations, and thus are classified into the five groups (step 104).

In step 106, retrieving the five power node inputs corresponding to the five groups mentioned above is performed by finding the power node inputs obtained in step 100. In this way, a starting order of the five power node inputs corresponding to the five groups can be obtained in accordance with the starting order between the power node inputs of step 102. For instance, the first inverter 202, the second inverter 204 and the level shifter 206 shown in FIG. 2 belong to a first power node P1, and the bandgap circuit 208 and the low dropout regulator 210 in FIG. 2 belong to a second power node P2. In addition, since the output voltage V12 generated from the low dropout regulator 210 is arranged for providing a supply voltage to the first inverter 202, the second inverter 204 and the level shifter 206, it can be seen that the second power node P2 has a start order prior to that of the first power node P1.

An enable signal is designated from the circuit design file of the integrated circuit to be a specific node in the step 108; thereby, a target path from the specific node can be retrieved in accordance with at least one passed group, at least a power node input corresponding to the group, and the starting order. For instance, a first connection line 207 is arranged to connect a level shifter output of the level shifter 206 and an enable terminal of the bandgap circuit 208 for enabling the bandgap circuit 208; the level shifter output of the level shift 206 can be designated as the enable signal mentioned above, and it is then retrieved both forwards and backwards from the level shifter output (i.e. checking occurs from a connection line 207 forwards and backwards) to obtain the target path (i.e. checking from a first connection line 201 connected to a input terminal of the first inverter 202, through the first inverter 202, a second connection line 203, the second inverter 204, a third connection line 205, the level shifter 206, a fourth connection line 207, the bandgap circuit 208, a fifth connection line 209, the low dropout regulator 210, and a sixth connection line 211). As a result, it is feasible to perform the deadlock detection (step 110) upon the target path according to the starting order and the power node inputs corresponding to the five groups. Preferably, this can be processed in accordance with the resource allocation graph algorithm for further speeding up the dead lock detection.

Please refer to Chapter VII, Eighth Edition, Operating System Concepts (2011), Gagne, G., Galvin, PB, & Silberschatz, A. for the details of the resource allocation graph algorithm. It should be noted that the resource allocation graph algorithm described in 'Operating System Concepts' is only for deadlock detection in the software (e.g. the operating system); however, through in-depth research and development, the disclosed embodiment of the present invention is capable of applying the deadlock detection method based on the resource allocation graph algorithm described in 'Operating System Concepts' to hardware. The present invention is able to apply the resource allocation graph algorithm described in 'Operating System Concepts' to the deadlock detection method for loops or paths in the circuit design file of the integrated circuit. Please refer to FIG. 3, which is a flowchart illustrating the step of performing deadlock detection upon the target path based on the resource allocation graph algorithm according to an exemplary embodiment of the present invention. Provided that substantially the same result is achieved, the steps in FIG. 3 need not be in the exact order shown and need not be contiguous; that is, other steps can be intermediate. Some steps in FIG. 3 may be omitted according to various types of embodiments or requirements. In this embodiment, the detailed operation of performing deadlock detection upon the target path based on the resource allocation graph algorithm may comprise the following steps:

Step 300: Designate at least one target group along the target path to be at least one process vertex;

Step 302: Designate at least one connection line along the target path to be at least one resource vertex;

Step 304: Designate at least one input of the target group along the target path to be at least one request edge;

Step 306: Designate at least one output of the target group along the target path to be at least one assignment edge;

Step 308: Compose a resource allocation graph by utilizing the process vertex, the resource vertex, the request edge, and the assignment edge; and Step 310: Perform the deadlock detection in accordance with the resource allocation graph algorithm and the resource allocation graph.

Figure 3:
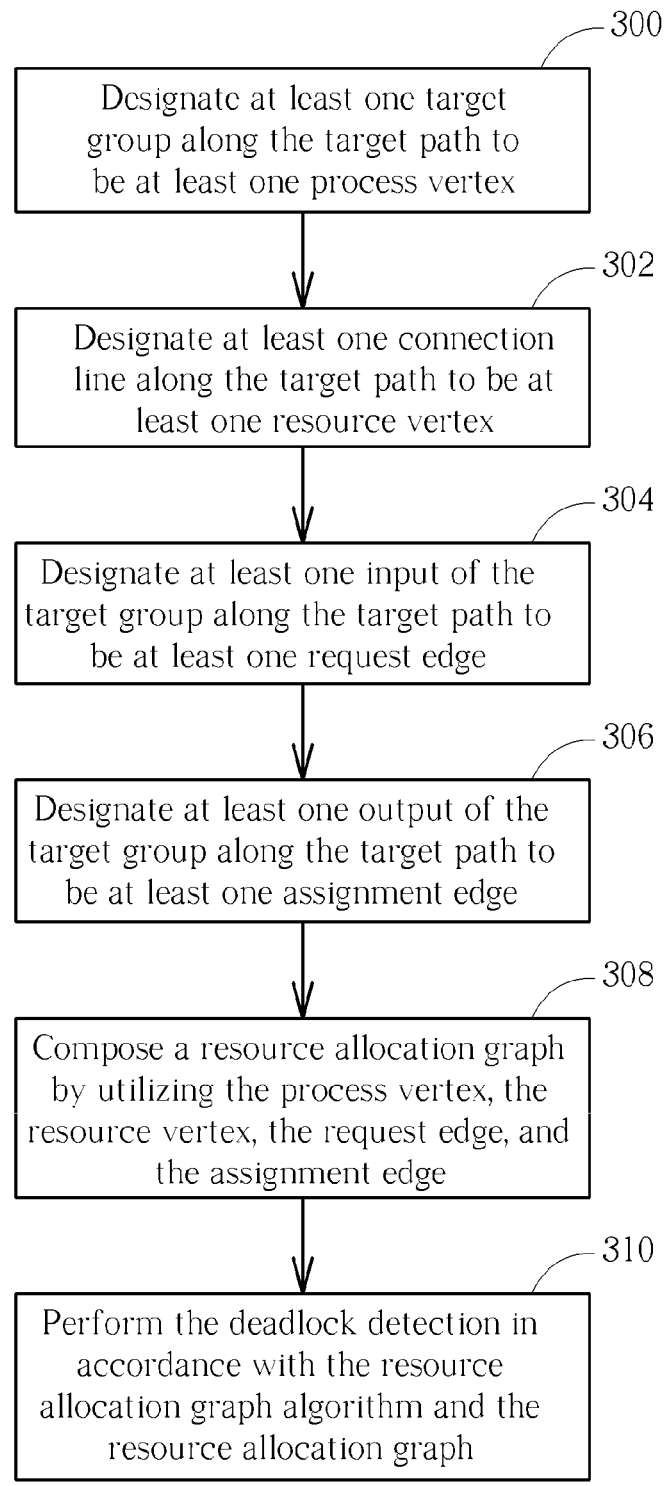
FIG. 3 is a flowchart illustrating the step of performing deadlock detection upon a target path based on a resource allocation graph algorithm according to an exemplary embodiment of the present invention.
Figure 4:
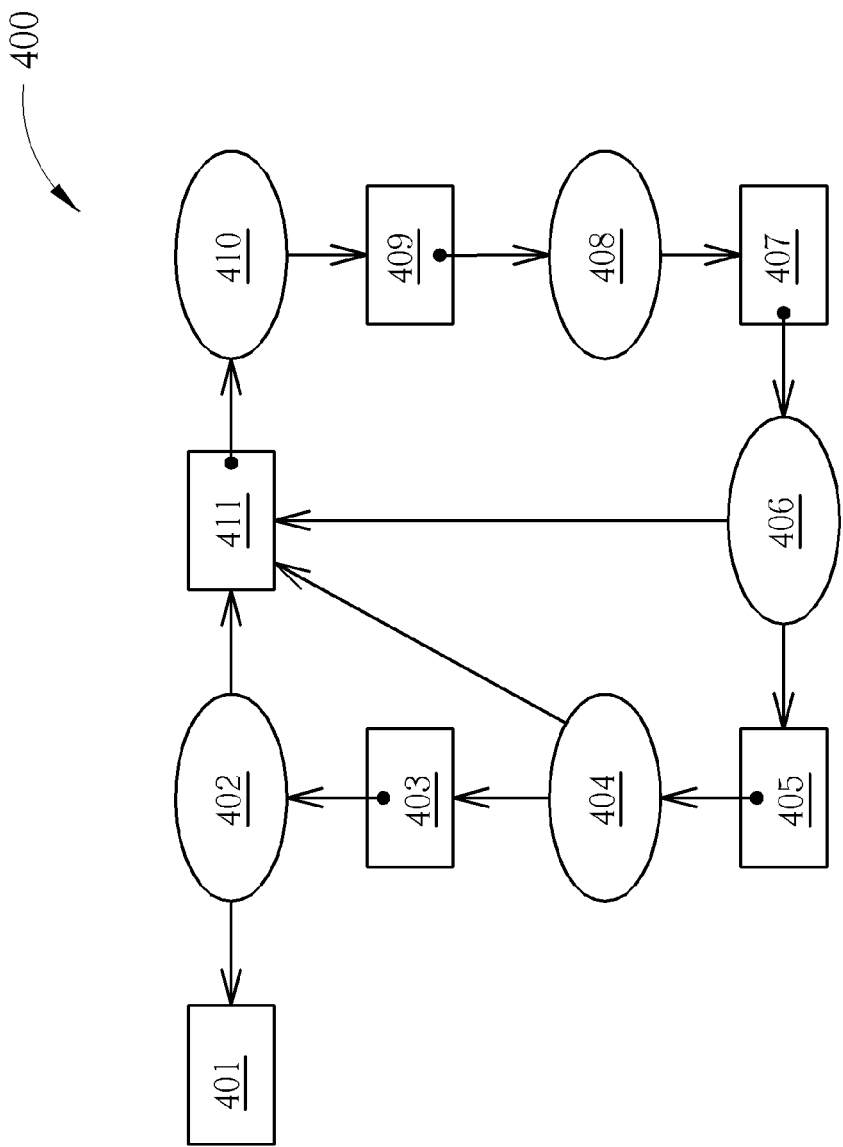
FIG. 4 is a diagram illustrating a resource allocation graph corresponding to the circuit shown in FIG. 2.

Please refer to FIG. 4 in conjunction with FIG. 3, wherein FIG. 4 is a diagram illustrating a resource allocation graph 400 which corresponds to the circuit shown in FIG. 2. As described in the above step 300, the target groups in FIG. 2 (i.e. the first inverter 202, the second inverter 204, the level shifter 206, the bandgap circuit 208 and the low dropout regulator 210) are designated as a first process vertex 402, a second process vertex 404, a third process vertex 406, a fourth process vertex 408, and a fifth process vertex 410, respectively. The connection lines of the target path in FIG. 2 (i.e. the first connection line 201, the second connection line 203, the third connection line 205, the fourth connection line 207, the fifth connection line 209, and the sixth connection line 211) are designated as a first resource vertex 401, a second resource vertex 403, a third resource vertex 405, a fourth resource vertex 407, a fifth resource vertex 409, and a sixth resource vertex 411, respectively. After obtaining the above process vertices and the resource vertices, the request edge is also determined according to the inputs of the target groups along the target path of the power control circuit 200 in FIG. 2. For example, since the input terminal of the first inverter 202 in FIG. 2 is connected to the first connection line 201, and therefore the arrow between the first process vertex 402 and the first resource vertex 401 shown in FIG. 4 is designated as a first request edge, the direction of the first request edge should be towards the first resource vertex 401 from the first process vertex 402. Similarly, the arrow between the second process vertex 404 and the second resource vertex 403 is designated as a second request edge, and the direction of the second request edge should be towards the second resource vertex 403 from the second process vertex 404; the arrow between the third process vertex 406 and the third resource vertex 405 is designated as a third request edge, and the direction of the third request edge should be towards the third resource vertex 405 from the third process vertex 406; the arrow between the fourth process vertex 408 and the fourth resource vertex 407 is designated as a fourth request edge, and the direction of the fourth request edge should be towards the fourth resource vertex 407 from the fourth process vertex 408; and the arrow between the fifth process vertex 410 and the fifth resource vertex 409 is designated as a fifth request edge, and the direction of the fifth request edge should be towards the fifth resource vertex 409 from the fifth process vertex 410.

Please note that the concept of requesting the resource allocation graph algorithm includes a request for signals (e.g. small signals) or power source by the process vertex, such as the path on which the low dropout regulator 210 provides power to the first inverter 202, the second inverter 204, and the level shifter 206 through the sixth connection line 211. Therefore the arrows between the first process vertex 402 and the sixth resource vertex 411, the second process vertex 404 and the sixth resource vertex 411, the third process vertex 406 and the sixth resource vertex 411 should be designated as a sixth request edge, a seventh request edge and a eighth request edge respectively, and the direction of the sixth request edge, the seventh request edge and the eighth request edge should be towards the sixth resource vertex 411 respective from the first process vertex 402, the second process vertex 404, and the third process vertex 406, respectively.

Assignment edges need to be designated in accordance with the outputs of the target groups on the target path of the power control circuit 200 in FIG. 2. For instance, a first inverter output of the first inverter 202 in FIG. 2 is connected to the second connection line 203, therefore the arrow between the first process vertex 402 and the second resource vertex 403 shown in FIG. 4 will be designated as a first assignment edge, and the direction of the first assignment edge is towards the first process vertex 402 from the second resource vertex 403. Similarly, the arrow between the second process vertex 404 and the third resource vertex 405 will be designated as a second assignment edge, and the direction of the second assignment edge is towards the second process vertex 404 from the third resource vertex 405; the arrow between the third process vertex 406 and the fourth resource vertex 407 will be designated as a third assignment edge, and the direction of the third assignment edge is towards the third process vertex 406 from the fourth resource vertex 407; and the arrow between the fourth process vertex 408 and the fifth resource vertex 409 will be designated as a fourth assignment edge, and the direction of the fourth assignment edge is towards the fourth process vertex 408 from the fifth resource vertex 409.

Please note that the concept of assigning the resource allocation graph algorithm includes the assignment for signals (e.g. small signals) or power source by the process vertex, such as the path on which the low dropout regulator 210 provides power to the first inverter 202, the second inverter 204, and the level shifter 206 through the sixth connection line 211. Therefore the arrow between the fifth process vertex 410 and the sixth resource vertex 411 should be designated as a fifth assignment edge, and the direction of the fifth assignment edge should be towards the fifth process vertex 410 from the sixth resource vertex 411.

According to the above descriptions, the resource allocation graph 400 can be constructed based on the first process vertex 402, the second process vertex 404, the third process vertex 406, the fourth process vertex 408, the fifth process vertex 410, the first resource vertex 401, the second resource vertex 403, the third resource vertex 405, the fourth resource vertex 407, the fifth resource vertex 409, the sixth resource vertex 411, the first request edge, the second request edge, the third request edge, the fourth request edge, the fifth request edge, the sixth request edge, the seventh request edge, the eighth request edge, the first assignment edge, the second assignment edge, the third assignment edge, the fourth assignment edge, the fifth assignment edge. The above process will be followed by performing deadlock detection upon the resource allocation graph 400, which consists of the target paths in the power control circuit 200, in accordance with the resource allocation graph algorithm described in Chapter VII, Operating System Concepts. This process obtains the deadlock detection result accordingly to indicate whether a deadlock issue exists in the power control circuit 200, e.g. that the source of the enable signal of the low dropout regulator 210 comes from the first inverter 202 but the power of the first inverter 202 is provided by the low dropout regulator 210, thereby inducing a deadlock problem.

Figure 5:
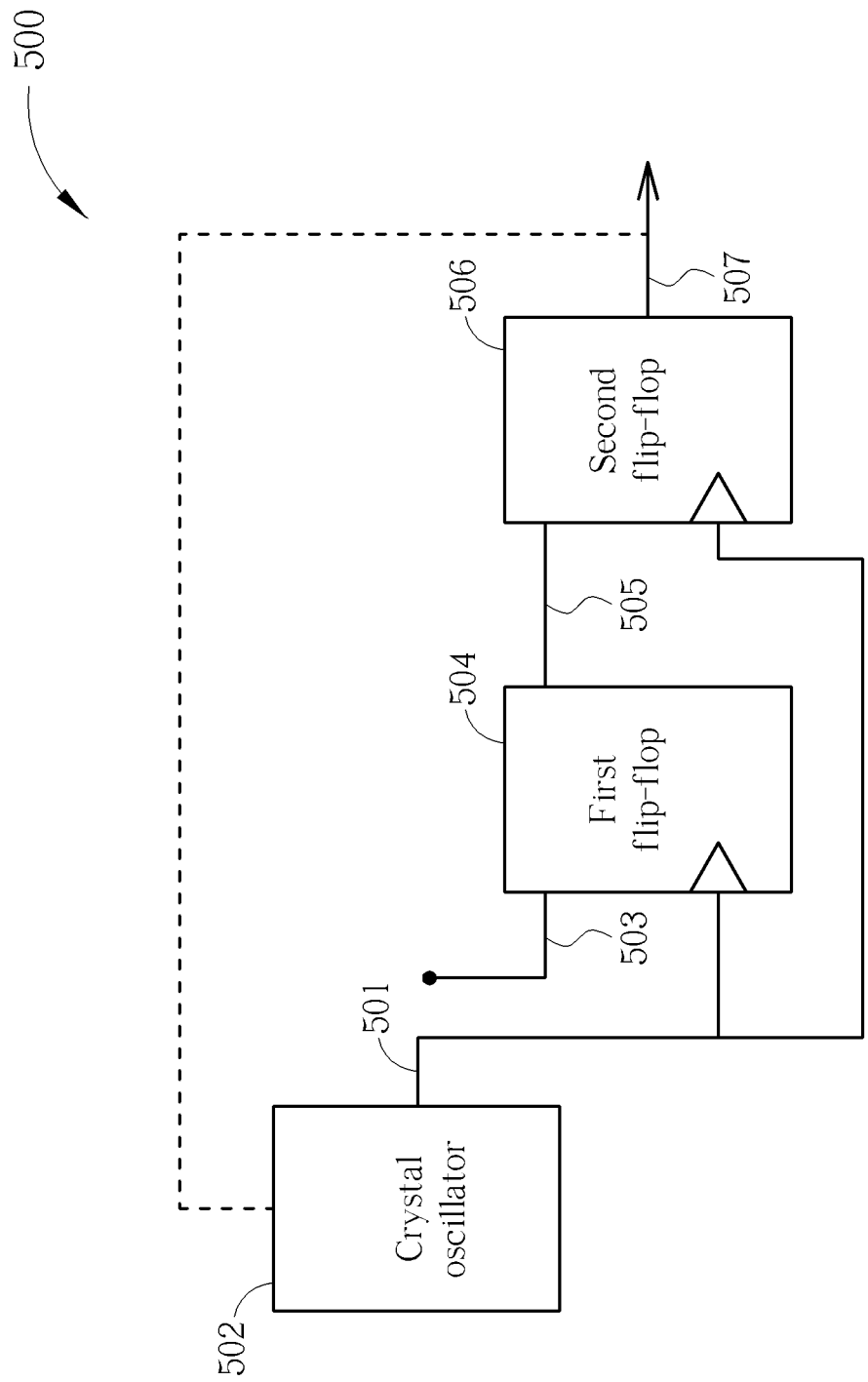
FIG. 5 is a diagram illustrating the deadlock detection method according to another exemplary embodiment of the present invention.

Please refer to FIG. 5, which is a diagram illustrating the deadlock detection method according to another exemplary embodiment of the present invention. A clock control circuit 500 shown in FIG. 5 includes a crystal oscillator 502, a first flip-flop 504 and a second flip-flop 506. In this embodiment, the complex basic components in the clock control circuit 500 can be classified in accordance with three main functional components shown in FIG. 5. The respective basic components of the crystal oscillator 502, the first flip-flop 504 and the second flip-flop 506 have respective correlations, thus being classified into the three groups (step 104). Next, a starting order of the three power node inputs corresponding to the three groups can be obtained in accordance with the starting order between the power node inputs of step 102, where the three power node could belong to one same power source or different power sources. In addition, an enable signal is designated as a specific node in step 108, for instance, a fourth connection line 507 is arranged to connect a second flip-flop output of the second flip-flop 506 and an enable terminal of the crystal oscillator 502 for enabling the crystal oscillator 502. The second flip-flop output of the second flip-flop 506 can be designated as the enable signal mentioned above, and then retrieved forwards and backwards from the second flip-flop output (i.e. searching started from a fourth connection line 507 forwards and backwards) to obtain the target path (i.e. starting from a second connection line 503, through the first flip-flop 504, a third connection line 505, the second flip-flop 506, a fourth connection line 507, the crystal oscillator 502, and a first connection line 501). As a result, it is feasible to perform the deadlock detection (step 110) upon the target path according to the starting order and the power node inputs corresponding to the three groups. Preferably, this could be processed in accordance with the resource allocation graph algorithm for further speeding up the deadlock detection.

Figure 6:
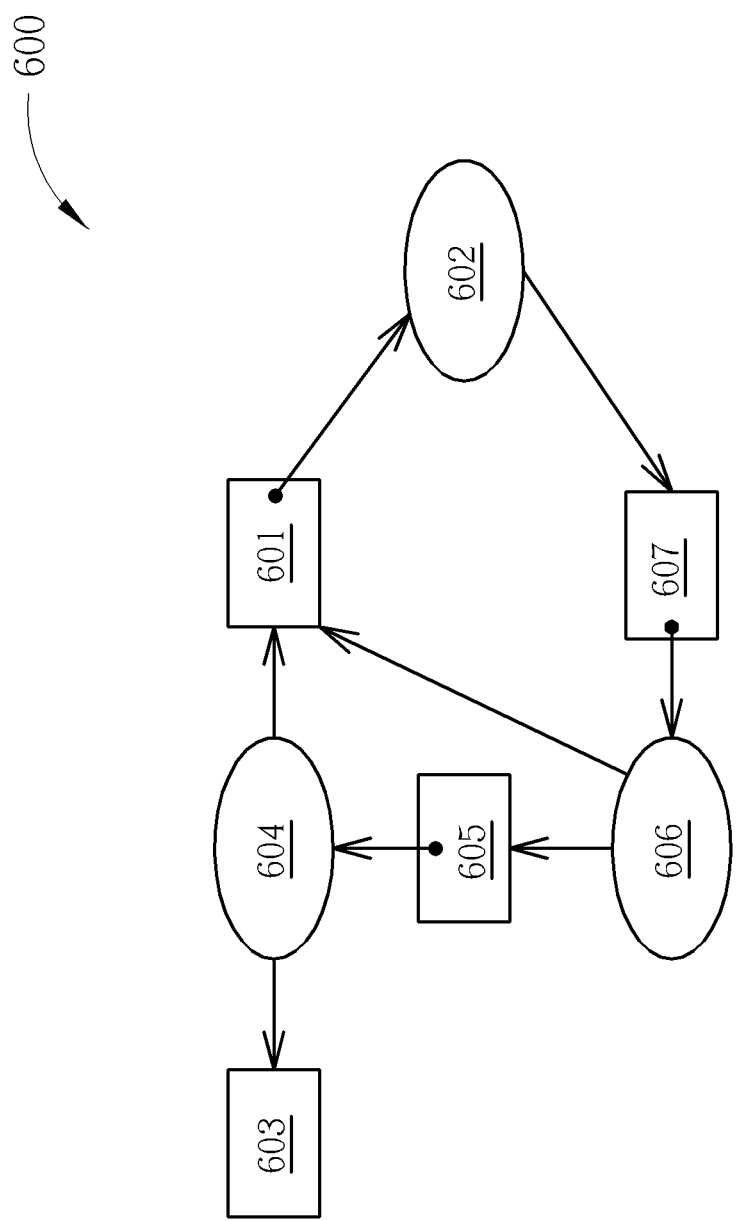
FIG. 6 is a diagram illustrating a resource allocation graph corresponding to the circuit shown in FIG. 5.

Please refer to FIG. 6 in conjunction with FIG. 5, wherein FIG. 6 is a diagram illustrating a resource allocation graph 600 which corresponds to the circuit shown in FIG. 5. As described in step 300, the target groups in FIG. 5 (i.e. the crystal oscillator 502, the first flip-flop 504, and the second flip-flop 506) are designated as a first process vertex 602, a second process vertex 604, and a third process vertex 606, respectively. The connection lines of the target path in FIG. 5

(i.e. the first connection line 501, the second connection line 503, the third connection line 505, and the fourth connection line 507) are then designated as a first resource vertex 601, a second resource vertex 603, a third resource vertex 605, and a fourth resource vertex 607, respectively. After obtaining the above process vertices and the resource vertices, the request edge is also determined according to the inputs of the target groups along the target path of the clock control circuit 500 in FIG. 5. For example, since the input terminal of the crystal oscillator 502 in FIG. 5 is connected to the fourth connection line 507, and therefore the arrow between the first process vertex 602 and the fourth resource vertex 607 shown in FIG. 6 is designated as a first request edge, the direction of the first request edge should be towards the fourth resource vertex 607 from the first process vertex 602. Similarly, the arrow between the second process vertex 604 and the first resource vertex 601 is designated as a second request edge, and the direction of the second request edge should be towards the first resource vertex 601 from the second process vertex 604; the arrow between the third process vertex 606 and the first resource vertex 601 is designated as a third request edge, and the direction of the third request edge should be towards the first resource vertex 601 from the third process vertex 606; the arrow between the second process vertex 604 and the second resource vertex 603 is designated as a fourth request edge, and the direction of the fourth request edge should be towards the second resource vertex 603 from the second process vertex 604; and the arrow between the third process vertex 606 and the third resource vertex 605 is designated as a fifth request edge, and the direction of the fifth request edge should be towards the third resource vertex 605 from the third process vertex 606.

Assignment edges need to be designated in accordance with the outputs of the target groups on the target path of the clock control circuit 500 in FIG. 5. For instance, a crystal oscillator output of the crystal oscillator 502 in FIG. 5 is connected to the first connection line 501, therefore the arrow between the first process vertex 602 and the first resource vertex 601 shown in FIG. 6 will be designated as a first assignment edge and the direction of the first assignment edge is towards the first process vertex 602 from the first resource vertex 601. Similarly, the arrow between the second process vertex 604 and the third resource vertex 605 will be designated as a second assignment edge, and the direction of the second assignment edge is towards the second process vertex 604 from the third resource vertex 605; and the arrow between the third process vertex 606 and the fourth resource vertex 607 will be designated as a third assignment edge, and the direction of the third assignment edge is towards the third process vertex 606 from the fourth resource vertex 607.

According to the above descriptions, the resource allocation graph 600 can be constructed based on the first process vertex 602, the second process vertex 604, the third process vertex 606, the first resource vertex 601, the second resource vertex 603, the third resource vertex 605, the fourth resource vertex 607, the first request edge, the second request edge, the third request edge, the fourth request edge, the fifth request edge, the first assignment edge, the second assignment edge, and the third assignment edge. The above process will be followed by performing deadlock detection upon the resource allocation graph 600, which consists of the target paths in the clock control circuit 500, in accordance with the resource allocation graph algorithm described in Chapter VII, Operating System Concepts. This obtains the deadlock detection result for indicating whether a deadlock issue exists in the clock control circuit 500, e.g. the source of the enable signal of the crystal oscillator 502 comes from the first flip-flop 504, but the clock of the first flip-flop 504 is provided by the crystal oscillator 502, thereby inducing a deadlock problem.

Figure 7:
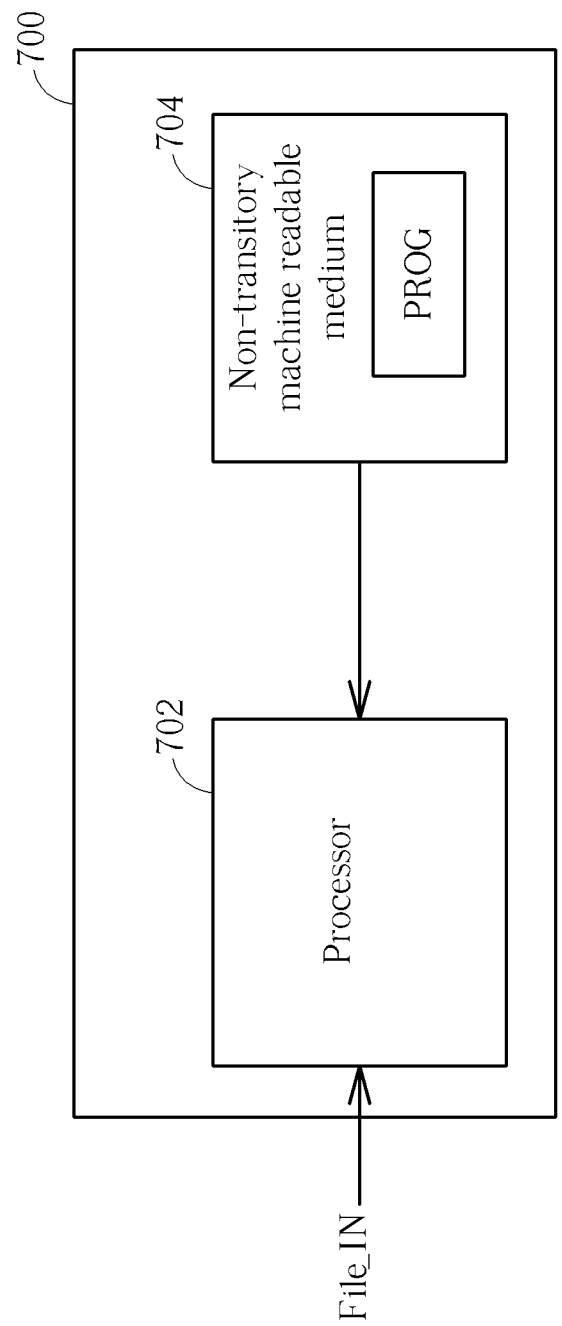
FIG. 7 is a diagram illustrating a computer system for performing deadlock detection according to an exemplary embodiment of the present invention.

Please refer to FIG. 7, which is a diagram illustrating a computer system for performing deadlock detection according to an exemplary embodiment of the present invention. The computer system 700 includes a processor 702 and a non-transitory machine readable medium 704. For instance, the computer system 700 could be a personal computer, and the non-transitory machine readable medium 704 could be any storage device capable of storing data in a personal computer, e.g., volatile memory, non-volatile memory, hard disk, CD-ROM, etc. In this embodiment, the non-transitory machine readable medium 704 stores a program code PROG, wherein when the program code PROG is loaded and executed by the processor 702, the program code PROG enables the processor to perform the disclosed deadlock detection method (i.e. the steps 100-110 shown in FIG. 1 and the steps 300-310 shown in FIG. 3) of the present invention upon the circuit design file File_IN of the integrated circuit. Those skilled in the art will readily understand the deadlock detection processed by making the processor 702 execute the program code PROG, therefore, further description will be omitted here for brevity.

According to the disclosed embodiments of the present invention, the power control circuit 200 and the clock control circuit 500 can be converted to the resource allocation graph 400 and the resource allocation graph 600 respectively, and the deadlock detection can be performed upon the resource allocation graph 400 and the resource allocation graph 600 by utilizing the resource allocation graph algorithm mentioned in Chapter VII, Operating System Concepts. This ensures fast and accurate obtaining of the deadlock detection result to indicate whether a deadlock issue exists in the power control circuit 200 and the clock control circuit 500.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A deadlock detection method, comprising:
    retrieving at least one power node input of a circuit design file of an integrated circuit, wherein the power node input is an input node coupled to a power source to provide a power supply for a circuit design and power nodes belong to one same power source or different power sources;
    retrieving a starting order of the power node input, wherein a starting order of the power node inputs are obtained according to the relationship between the power node inputs;
    retrieving a target path starting from a specific node in accordance with the starting order; and
    utilizing a computer for performing deadlock detection in accordance with the starting order and the target path.

2. The deadlock detection method of claim 1, wherein the step of performing the deadlock detection in accordance with the starting order and the target path is performed in accordance with a resource allocation graph algorithm.

3. The deadlock detection method of claim 2, further comprising:
    partitioning a plurality of components of the circuit design file into at least one group; and
    retrieving at least one power node input corresponding to the group.

4. The deadlock detection method of claim 3, wherein the step of partitioning the plurality of components of the circuit design file comprises:

partitioning the plurality of components of the circuit design file into the group in accordance with correlations of the functions between the plurality of components.

5. The deadlock detection method of claim 3, wherein the specific node is a starting signal node.

6. The deadlock detection method of claim 3, wherein the step of retrieving the target path starting from the specific node in accordance with the starting order comprises:
retrieving the target path starting from the specific node in accordance with at least one group passed, the power node input corresponding to the group and the starting order.

7. The deadlock detection method of claim 3, wherein the step of performing the deadlock detection in accordance with the resource allocation graph algorithm comprises:
designating at least one target group along the target path to be at least one process vertex;
designating at least one connection line along the target path to be at least one resource vertex;
designating at least one input of the target group along the target path to be at least one request edge;
designating at least one output of the target group along the target path to be at least one assignment edge;
composing a resource allocation graph by utilizing the process vertex, the resource vertex, the request edge, and the assignment edge; and
performing the deadlock detection in accordance with the resource allocation graph algorithm and the resource allocation graph.

8. A non-transitory machine readable medium stores a program code, wherein when executed by a processor, the program code enables the processor to perform the following steps:
retrieving at least one power node input of a circuit design file of an integrated circuit, wherein the power node input is an input node coupled to a power source to provide a power supply for a circuit design and power nodes belong to one same power source or different power sources;
retrieving a starting order of the power node input, wherein a starting order of the power node inputs are obtained according to the relationship between the power node inputs;
retrieving a target path starting from a specific node in accordance with the starting order; and
performing deadlock detection in accordance with the starting order and the target path.

9. The non-transitory machine readable medium of claim 8, wherein the step of performing the deadlock detection in accordance with the starting order and the target path is performed in accordance with a resource allocation graph algorithm.

10. The non-transitory machine readable medium of claim 9, wherein the program code further enables the processor to perform the following steps:
partitioning a plurality of components of the circuit design file into at least one group; and
retrieving at least one power node input corresponding to the group.

11. The non-transitory machine readable medium of claim 10, wherein the specific node is a starting signal node.

12. The non-transitory machine readable medium of claim 10, wherein the step of retrieving the target path starting from the specific node in accordance with the starting order comprises:
retrieving the target path starting from the specific node in accordance with at least one group passed, the power node input corresponding to the group and the starting order.

13. The non-transitory machine readable medium of claim 10, wherein the step of performing the deadlock detection in accordance with the resource allocation graph algorithm comprises:
designating at least one target group along the target path to be at least one process vertex;
designating at least one connection line along the target path to be at least one resource vertex;
designating at least one input of the target group along the target path to be at least one request edge;
designating at least one output of the target group along the target path to be at least one assignment edge;
composing a resource allocation graph by utilizing the process vertex, the resource vertex, the request edge, and the assignment edge; and
performing the deadlock detection in accordance with the resource allocation graph algorithm and the resource allocation graph.

14. The non-transitory machine readable medium of claim 10, wherein the step of partitioning the plurality of components of the circuit design file comprises:
partitioning the plurality of components of the circuit design file into the group in accordance with correlations of the functions between the plurality of components.

\* \* \* \* \*